United States Patent
Forrest et al.

(10) Patent No.: US 11,362,311 B2
(45) Date of Patent: Jun. 14, 2022

(54) SUB-ELECTRODE MICROLENS ARRAY FOR ORGANIC LIGHT EMITTING DEVICES

(71) Applicant: THE REGENTS OF THE UNIVERSITY OF MICHIGAN, Ann Arbor, MI (US)

(72) Inventors: Stephen R. Forrest, Ann Arbor, MI (US); Yue Qu, Ann Arbor, MI (US)

(73) Assignee: THE REGENTS OF THE UNIVERSITY OF MICHIGAN, Ann Arbor, MI (US)

(*) Notice: Subject to any disclaimer, the term of this patent is extended or adjusted under 35 U.S.C. 154(b) by 0 days.

(21) Appl. No.: 16/193,105

(22) Filed: Nov. 16, 2018

(65) Prior Publication Data
US 2019/0181384 A1    Jun. 13, 2019

Related U.S. Application Data

(60) Provisional application No. 62/587,691, filed on Nov. 17, 2017.

(51) Int. Cl.
| H01L 51/52 | (2006.01) |
| G02B 3/00 | (2006.01) |
| H01L 51/50 | (2006.01) |

(52) U.S. Cl.
CPC ........ *H01L 51/5275* (2013.01); *G02B 3/0056* (2013.01); *G02B 3/0062* (2013.01); *H01L 51/5016* (2013.01); *H01L 51/5036* (2013.01)

(58) Field of Classification Search
CPC ............. H01L 21/5275; H01L 51/5016; H01L 51/5036; G02G 3/0056; G02B 3/0062
See application file for complete search history.

(56) References Cited

U.S. PATENT DOCUMENTS

| 4,769,292 A | 9/1988 | Tang |
| 5,247,190 A | 9/1993 | Friend |
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |

(Continued)

FOREIGN PATENT DOCUMENTS

| WO | 2008057394 A1 | 5/2008 |
| WO | 2010011390 A2 | 1/2010 |

OTHER PUBLICATIONS

Baldo et al. Highly efficient phosphorescent emission from organic electroluminescent devices, Nature, vol. 395, pp. 151-154, 1998.

(Continued)

*Primary Examiner* — Zandra V Smith
*Assistant Examiner* — Andre C Stevenson
(74) *Attorney, Agent, or Firm* — Riverside Law LLP

(57) ABSTRACT

Substrates are disclosed that include an embedded or partially-embedded microlens array. Devices are disclosed that include an OLED disposed over a substrate having an embedded or partially embedded micro lens array. Devices as disclosed herein redirect up to 100% of the light that otherwise would be confined in organic and electrode layers toward the substrate and thus provide improved light extraction and device efficiency.

16 Claims, 10 Drawing Sheets

(56) References Cited

U.S. PATENT DOCUMENTS

| | | | |
|---|---|---|---|
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 7,279,704 B2 | 10/2007 | Walters | |
| 7,431,968 B1 | 10/2008 | Shtein | |
| 7,968,146 B2 | 6/2011 | Wagner | |
| 8,742,406 B1 * | 6/2014 | Leung | H01L 51/5275 257/40 |
| 10,115,930 B2 | 10/2018 | Cui | |
| 2003/0230980 A1 | 12/2003 | Forrest | |
| 2004/0027675 A1 * | 2/2004 | Wu | G02B 3/0018 430/5 |
| 2004/0174116 A1 | 9/2004 | Lu | |
| 2009/0212011 A1 * | 8/2009 | Abe | G02B 3/0012 216/52 |
| 2010/0033829 A1 * | 2/2010 | Wippermann | G02B 27/01 359/623 |
| 2010/0201256 A1 * | 8/2010 | Xue | H05B 33/22 313/504 |
| 2012/0092747 A1 * | 4/2012 | Martin | G02B 3/0056 359/290 |
| 2017/0229663 A1 | 8/2017 | Tsai | |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

* cited by examiner

SUB-ELECTRODE MICROLENS ARRAY FOR ORGANIC LIGHT EMITTING DEVICES

CROSS-REFERENCE TO RELATED APPLICATIONS

This application is a non-provisional of, and claims the priority benefit of U.S. Provisional Patent Application Ser. No. 62/587,691, filed Nov. 17, 2017, the entire contents of which are incorporated herein by reference.

GOVERNMENT RIGHTS

This invention was made with government support under DE-EE0007626 awarded by the U.S. Department of Energy. The government has certain rights in the invention.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and Universal Display Corporation. The agreement was in effect on and before the effective filing date of the presently claimed invention, and the claimed invention was made as a result of activities undertaken within the scope of the agreement.

FIELD

The present invention relates to compounds for use as emitters, and devices, such as organic light emitting diodes, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
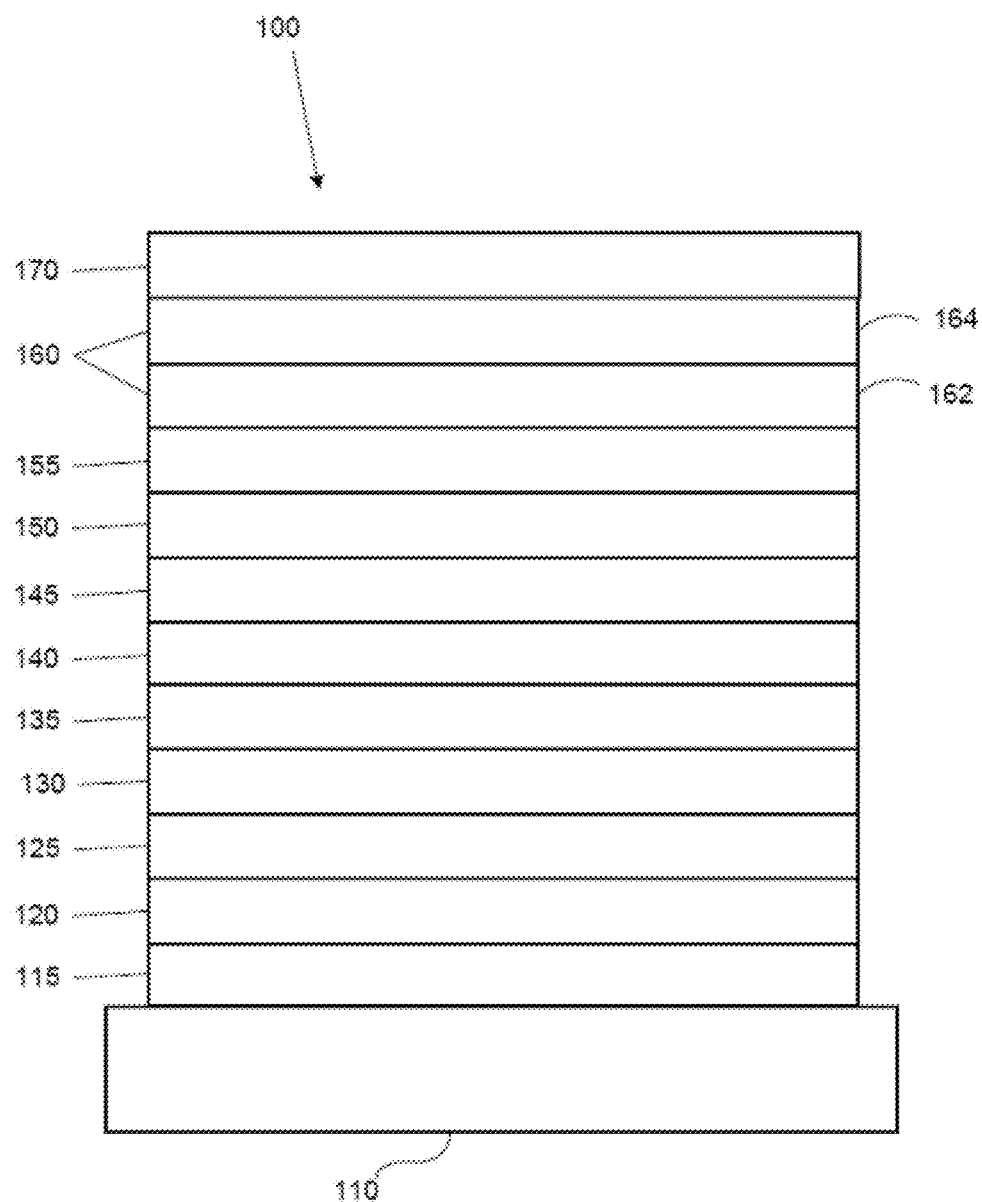
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
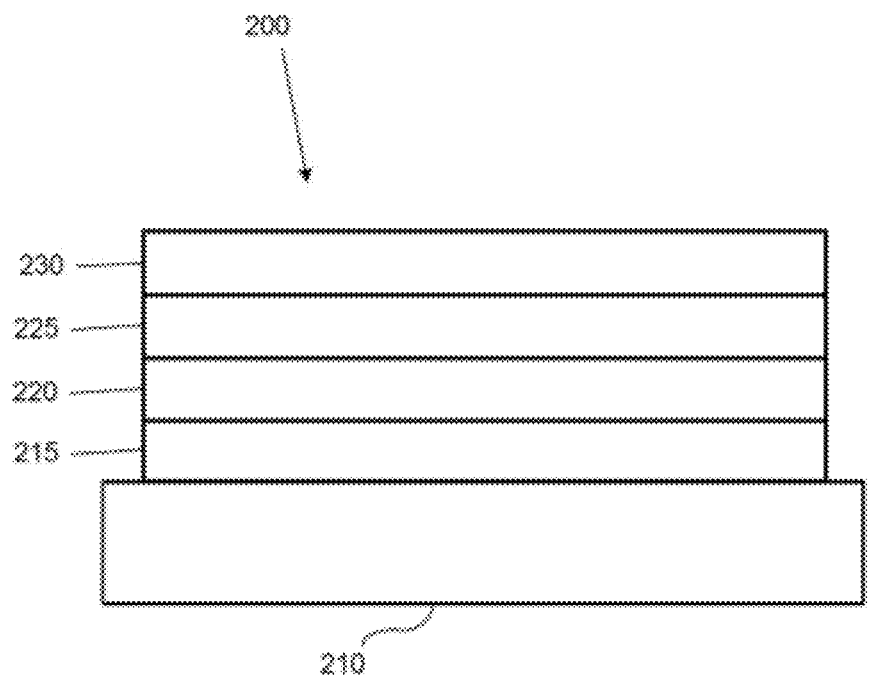
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Conventional OLEDs typically have an optical outcoupling efficiency of around 20% or less. Most of the light is trapped in surface plasmon modes (SPPs) at the metal electrode surface and in waveguide modes due to the high refractive index of organic materials and transparent electrodes. Conventional techniques to eliminate SPPs use a thick organic layer between the emissive layer(s) and a metal electrode. However, the thicker organic layers introduce more waveguided light, which results in little or no net change to the light extraction efficiency.

Embodiments disclosed herein address this and other issues with conventional OLED structure by including a microlens array disposed between the OLED substrates and transparent electrodes for both bottom and top-emitting OLEDs. The microlens array also may be at least partially embedded within the substrate. It has been found that high refractive index subelectrode microlens arrays embedded in a substrate and beneath the transparent bottom electrode of OLEDs as disclosed herein may redirect up to 100% of the light confined in organic and electrode layers toward the substrate. The placement of the microlens array below the OLED as disclosed herein allows for freedom in OLED design and fabrication; the nonintrusive flat upper surface of the lens array provides a surface similar to that of a conventional flat glass or plastic substrate. Both monochromatic and white PHOLEDs fabricated on SEMLA substrates with external outcoupling show extremely high efficiencies of $\eta_{EQE}=70\pm4\%$ with EF=2.8 for green and $\eta_{EQE}=50\pm3\%$ with EF=3.1 for the WOLED compared to analogous devices on conventional glass substrates. This is significantly more efficient light extraction than other reports of nonintrusive outcoupling structures. The blue shift eliminated at large angles along with no perceptible impact on image sharpness makes this method ideal for white light illumination and display applications. The spectrum of WOLEDs on SEMLA substrates remains identical with those on sapphire substrates, affording both higher efficiency and lower costs with no expense to performance or freedom in device design.

Figure 3:
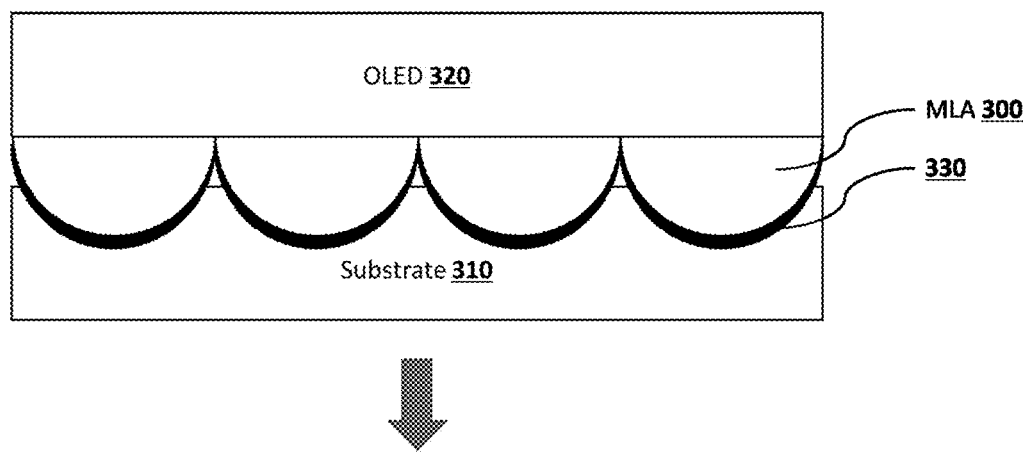
FIG. 3 shows a schematic representation of an OLED structure including a sub-electrode microlens array according to an embodiment disclosed herein.

FIG. 3 shows a schematic representation of an OLED structure as disclosed herein, which includes a microlens array disposed at least partially within the substrate. An OLED 320 is disposed over the substrate 310. The OLED 320 and substrate 310 may include some or all of the layers and structures described with respect to FIGS. 1 and 2. A microlens array (MLA) 300 is disposed between the OLED stack 320 and the substrate 310, and extends at least partially into the substrate 310 such that it is at least partially embedded in the substrate 310. In operation, the OLED 320 emits light directly or indirectly at least in the direction of the microlens array, though generally the OLED may have any stack structure as disclosed herein and as known in the art. Such an array may be referred to as a sub-electrode microlens array (SEMLA) since it is positioned below the bottom electrode of the OLED 320. It will be understood that the microlens array is not shown to scale relative to the OLED and the features may be exaggerated for purposes of illustration. In general, the microlens array will be a micron-scale array.

The refractive index of materials for the microlens may be the same or slightly higher than organic materials and the electrodes in the OLED, typically in the range 1.7-2. More generally, the microlens array should have an index of refraction higher than the index of refraction of the substrate, preferably at least 1% greater than the index of refraction of the substrate. It may be preferred for the microlens array to have a relatively high index, preferably not less than 1.7, not less than 1.8, or not less than 1.9. Alternatively or in addition, the substrate may have an index of refraction in the range of 1.4-1.5, such as may be expected for glass or similar substrates. In some configurations, one or more layers of the OLED also may have a relatively high index, such as not less than 1.7. The upper side of the microlens array structures may be planar to allow for deposition of organic devices. In this way, the outcoupling structures do not have any appreciable impact on the electrical properties of the devices. For bottom-emitting devices, microlens arrays may be fabricated directly on to or within the glass substrates. For top-emitting devices, a reflective layer 330 may be deposited between the substrate and the microlens array. The reflective layer may be a reflective metal, such as silver or aluminum, a transparent dielectric (typically for bottom-emitting configurations), or any other suitable reflective material. Preferably, the reflective layer 330 is at least 30% reflective, 40% reflective, 50% reflective, or more within the primary emission spectrum of the OLED 320. The reflective layer also may be or act as an environmental barrier, such as a portion of the encapsulation of the OLED/MLA arrangement.

Figure 4:
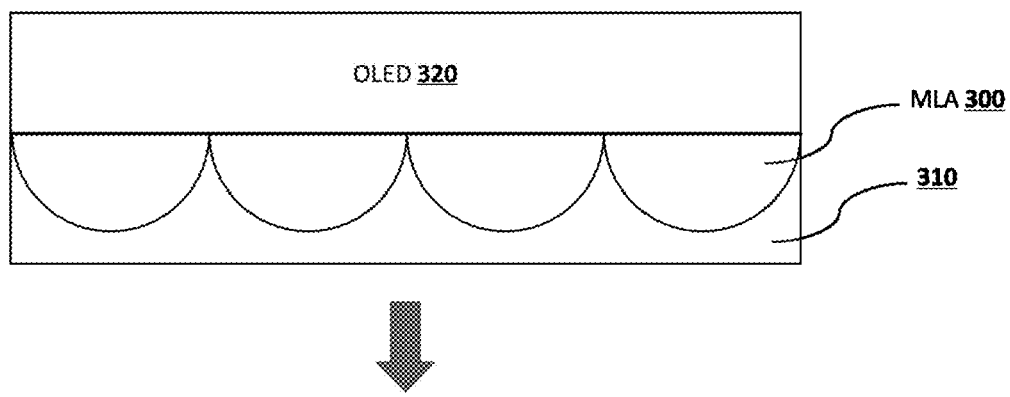
FIG. 4 shows a schematic representation of an OLED structure including a sub-electrode microlens array according to an embodiment disclosed herein.

As previously described, the microlens array 300 may be at least partially disposed within, i.e., embedded in the substrate, such that it is at least partially below the surface of the substrate closest to the OLED. The microlens array may be partially embedded within the substrate as shown in FIG. 3, or it may be entirely embedded within the substrate such that no non-planar portion of the microlens array extends above the surface of the substrate closest to the OLED, as shown in FIG. 4. That is, if the microlens array is entirely embedded within the substrate, the curved or otherwise non-planar surfaces of the array may be below the surface of the substrate closest to the OLED. It may be preferred for the microlens array to be entirely embedded within the substrate. Alternatively, for hemispherical microlenses the microlenses may be disposed a distance equal to or greater than ¼ of a peak wavelength of light emitted by the OLED. The microlens array may be embedded within the substrate such that a distance from the surface of the substrate closest to the OLED to the base of the microlens array may be in the range 10 nm-30 µm. As used herein, the "base" of the microlens array refers to the planar surface of the microlens array, i.e., the base of the plurality of lenses in the array. The microlenses themselves may be on the order of 10 µm or less, or generally may be of micron scale.

Figure 5:
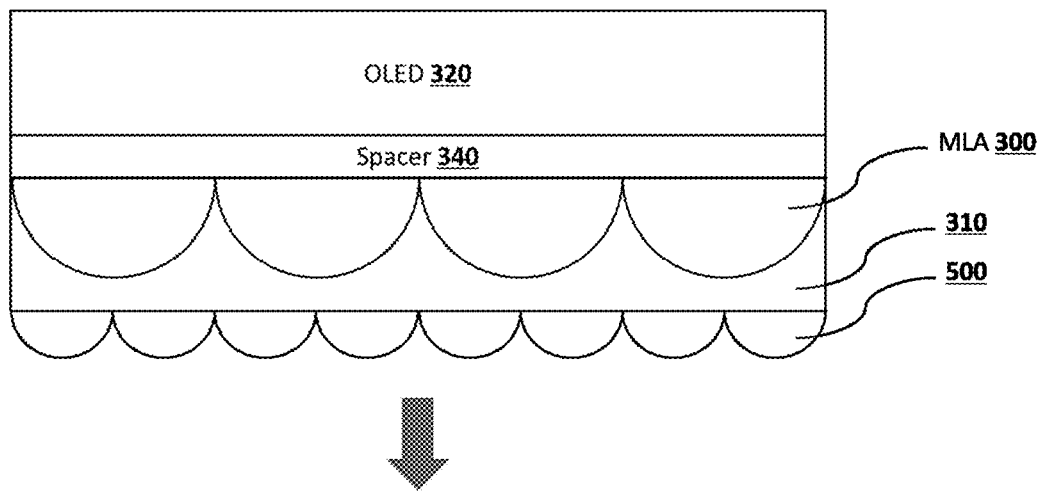
FIG. 5 shows a device arrangement that includes a spacer layer disposed above a microlens array according to an embodiment disclosed herein.

FIG. 5 shows an arrangement that includes a spacer layer 340 disposed above the microlens array. The spacer layer may include the same material as in the microlens array. It may be preferred for the spacer layer to have an index of refraction close to or, preferably the same as that of the microlens array. The spacer layer also may function as a planarizing layer, such as to prevent the requirement of fabricating an OLED on a non-uniform base of a microlens array due to manufacturing nonuniformities, inherent gaps between non-adjacent lenses in the array, or the like. The spacer layer 340 may be fabricated separately or continuously with the microlens array, such that there is not a discernable seam or other interface between the two. The spacer/planarizing layer may have a refractive index within about 10% of the refractive index of the microlens array or, preferably, it may have an index equal to that of the microlens array. The spacer layer may be distinguished from the microlens array in that the spacer layer may be uniform across its thickness, i.e., in a direction normal to the substrate. In contrast, the microlens array exhibits non-uniformities across its thickness. For example, as explained in further detail herein, the microlens array may include multiple hemispherical lenses or other structures that have space between at least part of them at various points in the microlens array layer, whereas the spacer layer has no such structures. FIG. 5 also shows a second microlens array 500 that may be disposed below the substrate. This external microlens array may be used in conjunction with the SEMLA 300, for example to further increase light extraction from the substrate or provide other effects.

Figure 6:
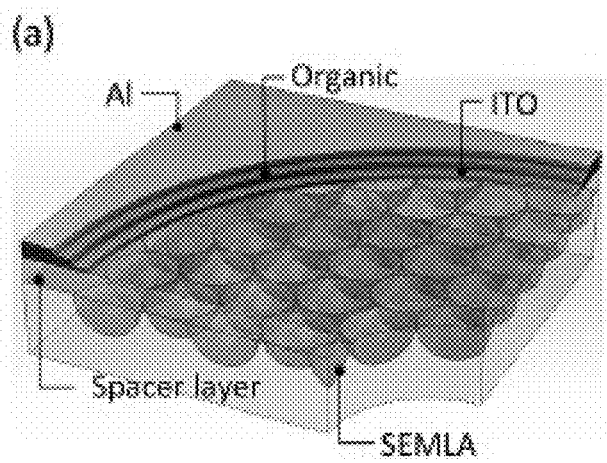
FIG. 6 shows a perspective cut-away view of a device having a sub-electrode microlens array embedded in a substrate according to an embodiment disclosed herein.

FIG. 6 shows a perspective cut-away view of a device having a SEMLA embedded in the substrate. The device shown in FIG. 6 may include any or all of the features previously described with respect to FIGS. 3-5.

Figure 7:
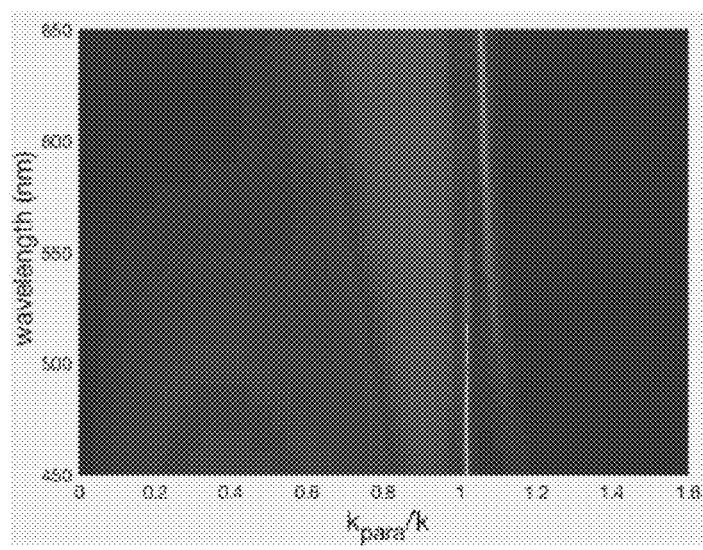
FIG. 7 shows simulated results for a device having an embedded microlens array according to an embodiment disclosed herein.
Figure 8:
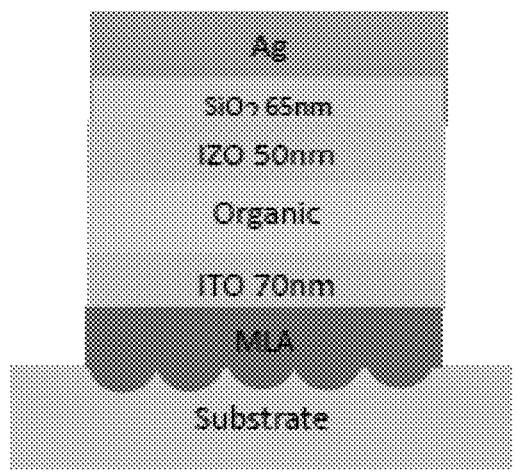
FIG. 8 shows the structure of the device used to generate the simulation results shown in FIG. 7.
Figure 9:
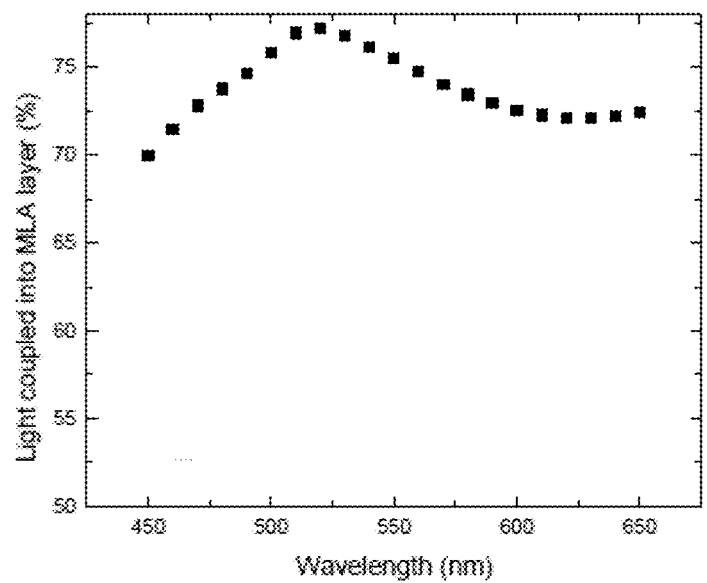
FIG. 9 shows the light extraction efficiency of the structure shown in FIG. 8.

For bottom-emitting OLEDs, the shape of the microlenses in the array may be a hemisphere, tetrahedron, or any other suitable shape. It may be desirable for the microlens array to be made from one or more materials having a comparable refractive index to organic materials and transparent electrodes in the active region of the OLED to eliminate the waveguide modes as shown in FIG. 7, which shows simulated results for a device as disclosed herein with an embedded MLA. The simulated structure is shown in FIG. 8. IZO and ITO electrodes provide charge injection. A silicon dioxide layer provides a large space between the emissive layer and the metal surface, thereby preventing or reducing SPP coupling. Due to the similar refractive index of the microlens material and organic materials in OLEDs, the cavity of the structure is weak, making the wavelength dependent trivial. As shown in FIG. 9, the light extraction efficiency by this structure is almost wavelength independent.

Figure 10:
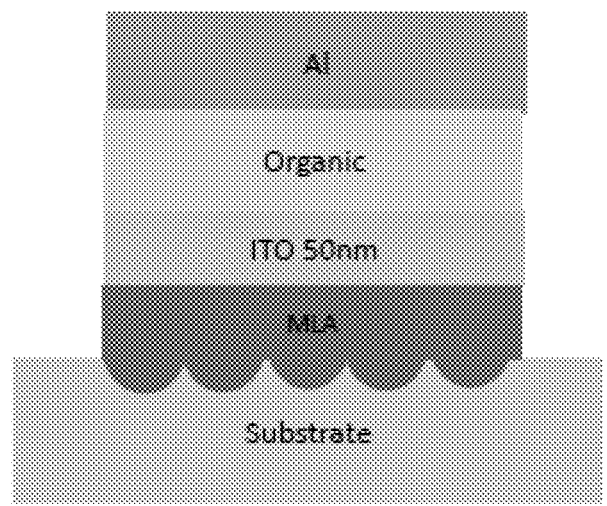
FIG. 10 shows the structure of a device having a sub-electrode microlens array according to an embodiment disclosed herein.
Figure 11A:
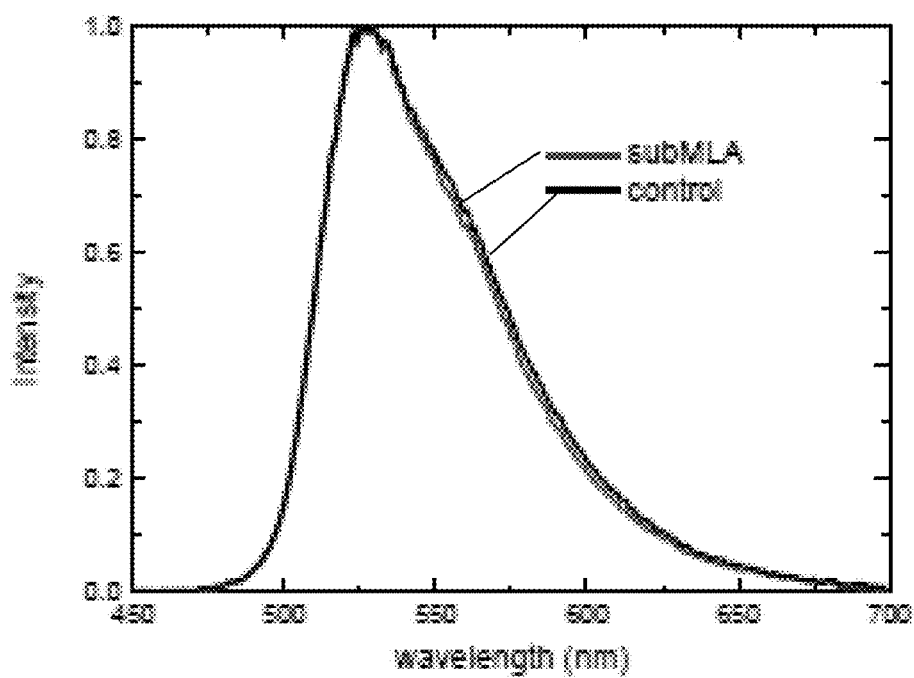
FIGS. 11A, 11B, and 11C show experimental results for a fabricated device having the structure shown in FIG. 10.
Figure 11B:
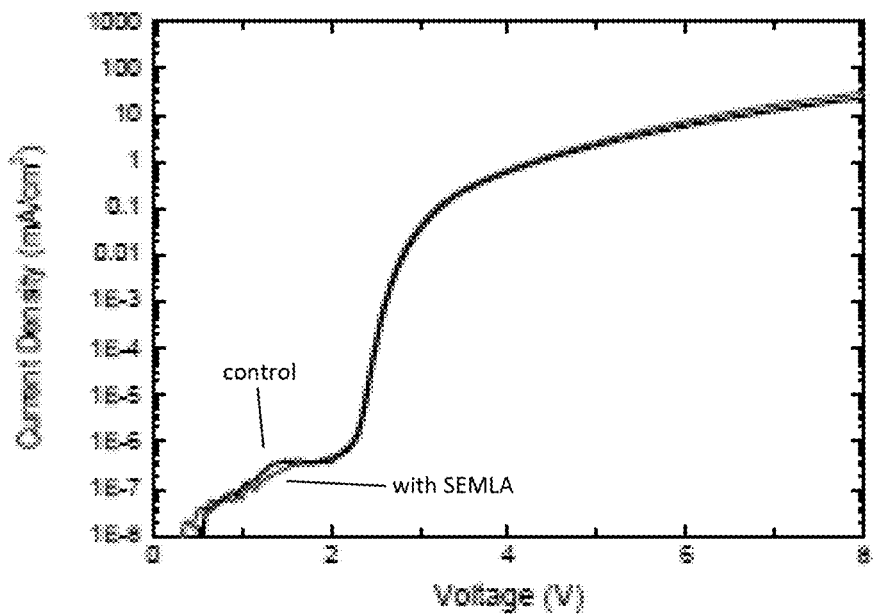
Figure 11C:
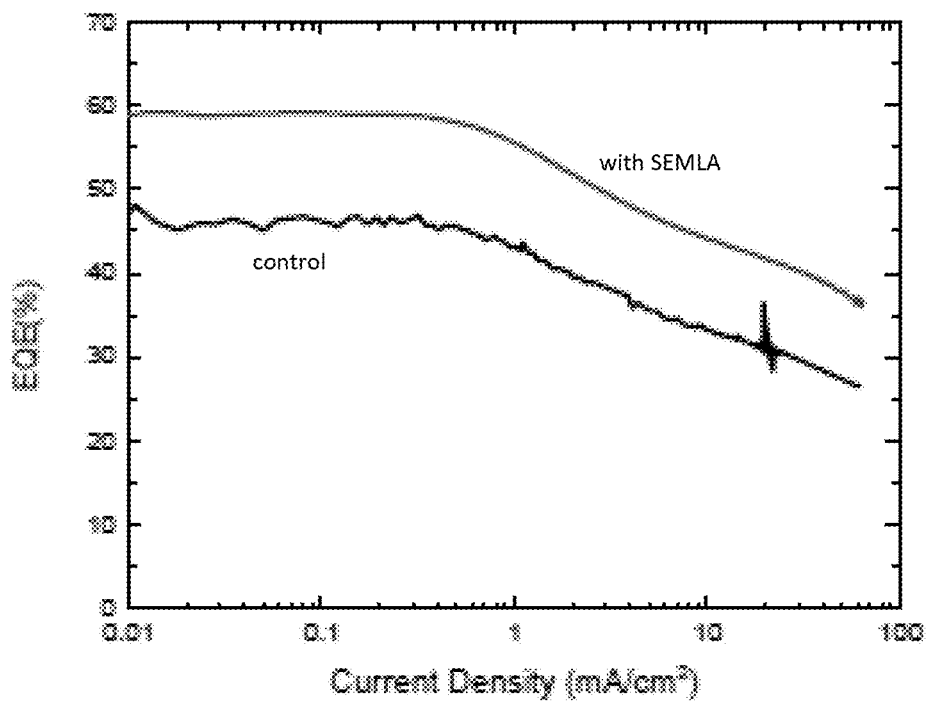

Due to the small refractive index contrast between the microlens material and glass substrate, the transmission through the interface is found to be relatively high. The structure of a device fabricated using this arrangement is shown in FIG. 10. A refractive matching fluid was used to extract all the light from the glass substrate. Thus, the enhancement is directly from the extraction of waveguide modes. The active region of the OLED structure is: 50 nm ITO/40 nm TAPC/25 nm CBP: Ir(ppy)$_2$acac/60 nm BPhen/ 1.5 nm LiQ/Al. The experimental results for the device having the structure shown in FIG. 10 are shown in FIGS. 11A-11C. As shown in FIG. 11C, the extraction efficiency was found to be enhanced by 20% by the presence of the sub-electrode MLA, which is the fraction of waveguide modes according to our calculation.

For top-emitting OLEDs, the microlens refractive index also may be comparable with the organic materials and the transparent electrodes in the OLED stack. The SPP modes may be eliminated without the use of metallic electrodes in this structure. It may be preferred for the microlenses to be a fraction of a sphere with a focus plane located within the organic layers of the OLED active region. Due to the relatively high refractive index of the microlens array layer, no waveguided modes exist. The light trapped in the devices will be reflected from the mirror and redirected into the light cone. Eliminating both waveguide and SPP modes suggest that this method can achieve outcoupling of 80% of the emitted light. It was found that use of a metal electrode alone in such a configuration may result in up to 60% of light being outcoupled.

The arrays in the example device shown and described with respect to FIGS. 10-11 were made by etching hemispheres in a glass substrate and then filling the hemispheres them with polymer. Similar techniques may be used to create SEMLAs having other shapes as previously disclosed. Other methods, including thermoforming, stamping, molding and the like also may be used.

Notably, embodiments disclosed herein may provide significant advantages over conventional techniques that use a high-index microlens array having an air gap between the lens array and the substrate. It is believed that such an arrangement negatively impacts outcoupling from the device. Furthermore, it requires more complex fabrication techniques because the light must first enter the air and then go the substrate. The contact area would not have this problem, but such contact is limited in such configurations to only the apexes of the microlens area. The high refractive index microlens may remove the waveguide modes but has lower extraction efficiency from substrate modes due to higher index contrast between microlens and the air. Accordingly, embodiments disclosed herein may address both issues at the same time.

Referring again to the structure shown in FIGS. 5 and 6 for reference, as a specific example a subelectrode microlens array as disclosed herein may include a flat spacer layer on top of a closed-packed array of 10 µm diameter hemispherical lenses with a refractive index ($n_{SEMLA}$) of 1.8. The lenses may be closely packed, i.e., there may be no flat plateau area between adjacent lenses in the microlens array. As previously disclosed, the planar surface of the SEMLA may be smooth to eliminating optical scattering from the structure. As previously noted, the microlens structure does not intrude into the OLED active region and therefore places no constraints on the design of the OLED itself. The lens array may be fabricated using conventional photolithography as disclosed herein, while being smaller than a conventional display pixel size (typically >30 µm).

Figure 12:
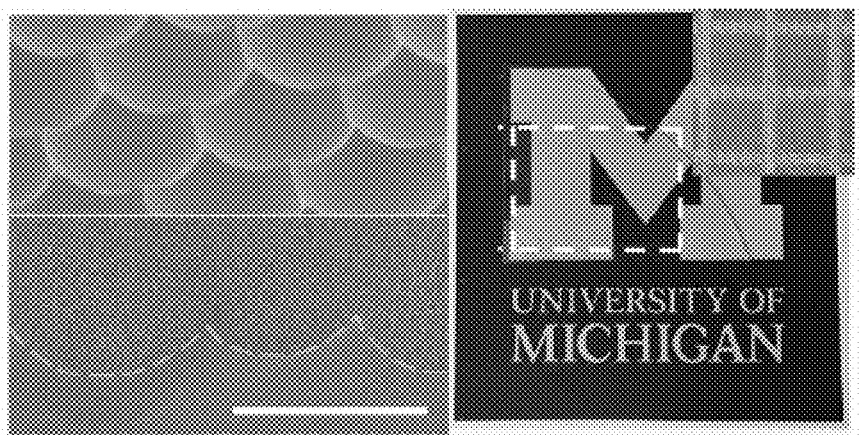
FIG. 12 shows an image of a glass substrate containing a sub-electrode microlens array (SEMLA) structure on a printed background according to an embodiment disclosed herein.

FIG. 12 shows an image of a glass substrate containing the SEMLA structure (highlighted by dashed lines) on a printed background, with no apparent impact on the image sharpness, and a microscopic image of a section of a glass substrate covered by the SEMLA structure. The substrate is patterned with a square grid with a 100 μm period and 20 μm wide metal gridlines, which is comparable to a mobile phone display pixel size. Notably, the SEMLA has a negligible impact on image resolution when magnified at this level.

Figure 13A:
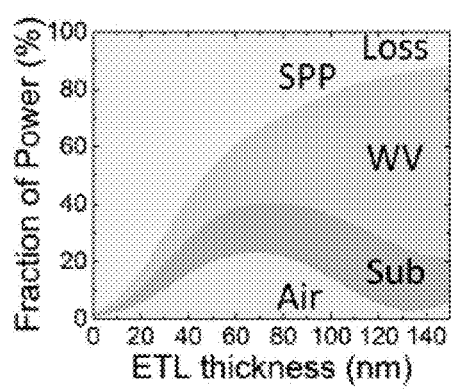
FIGS. 13A and 13B show the calculated optical power distribution in devices having a SELMA as disclosed herein and without the SEMLA based on Green's function analysis.
Figure 13B:
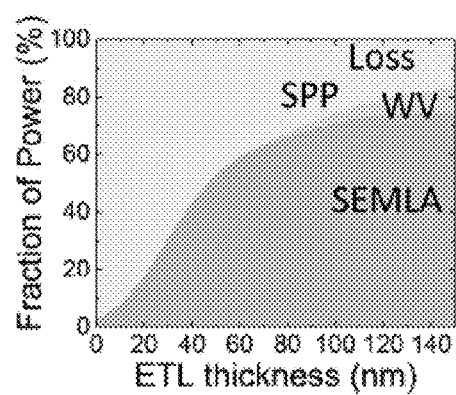
Figure 13C:
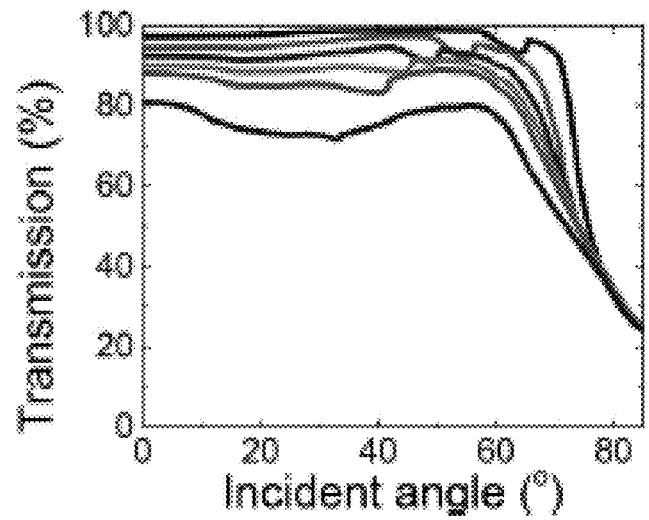
FIG. 13C shows the ratio of refractive indices for the microlens (nlens) to the embedded medium according to an embodiment disclosed herein.

As previously disclosed, the use of a relatively high refractive index SEMLA extracts waveguide modes from organic and ITO anode layers. FIGS. 13A and 13B show the calculated optical power distribution in devices with a SELMA as disclosed herein and without the SEMLA based on Green's function analysis, assuming that the spacer layer is semi-infinite as disclosed herein. The device structure used in the calculation is the following: 40 nm ITO anode/40 nm hole transport layer/20 nm emission layer/electron transport layer/Al cathode. For the SEMLA refractive index of $n_{SEMLA}=1.8$, the waveguide modes are reduced to almost zero for an electron transport layer thickness of <70 nm, with the SEMLA structure extracting all radiated optical power except for the surface plasmon modes. It is expected that the optical power exits into the glass substrate from the microlens array. The light extraction from the SEMLA into glass ($n_{glass}=1.45$) is more efficient than from a conventional external MLA ($n_{MLA}=1.4-1.5$) into air ($n_{air}=1$) due to reduced reflection at the lens/glass interface with its larger critical angle. This behavior has been verified by a ray tracing simulation, with the results shown in FIG. 13C. FIG. 13C shows the ratio of refractive indices for the microlens ($n_{lens}$) to the embedded medium, i.e., the substrate ($n_{out}$). Values for $n_{lens}/n_{out}$ of 1.1, 1.2, 1.3, 1.4, 1.5, and 1.8 are shown from top to bottom of the graph. The discontinuities in the transmission spectra result from total internal reflection at the flat plateaus between the lenses. As the ratio $n_{lens}/n_{out}$ of refractive indices increases, the transmission at all incident angles decreases. Thus, it may be preferred to select $n_{SEMLA}$ to be sufficiently high enough to suppress waveguide modes in the organic and ITO layers, but not so high that the array itself becomes waveguiding. Air gaps between the substrate and the MLA may increase reflections and, hence, may be avoided in structures disclosed herein. Because the total transmission through a microlens array also depends on the angular profile of the emission source, the light extraction efficiency into the substrate may vary for different organic cavities.

To demonstrate the enhancement in light extraction, green and white PHOLEDs (WOLEDs) were fabricated on conventional glass, sapphire ($n_{sapphire}=1.77$), and SEMLA substrates. An external MLA such as shown in FIG. 5 was also attached to SEMLA substrates to further enhance outcoupling. The total quantum efficiency of both air and substrate modes was measured using a commercial index matching fluid (IMF) to measure the extraction efficiency of trapped light from the ITO and organic layers. The IMF indices were $n_{IMF,low}=1.51$ for the SEMLA and conventional glass substrates and $n_{IMF,high}=1.70$ for sapphire, enabling outcoupling of substrate modes.

Figure 14A:
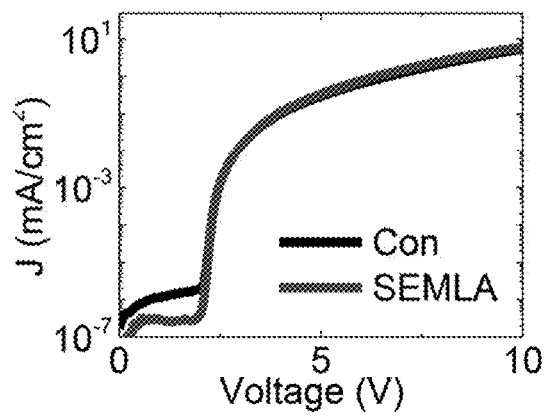
FIGS. 14A, 14B, and 14C show performance characteristics of a green PHOLED with different substrates according to embodiments disclosed herein.
Figure 14B:
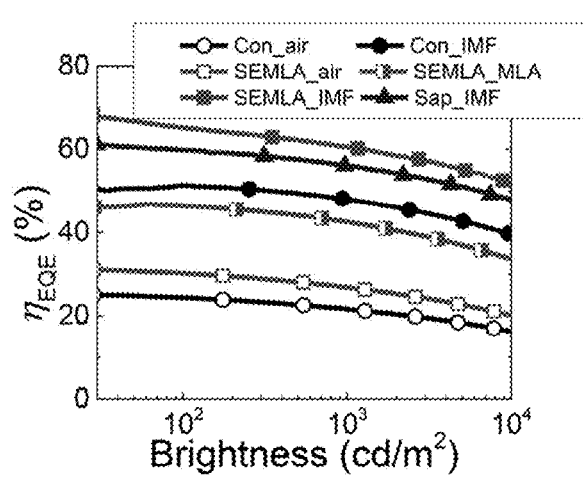
Figure 14C:
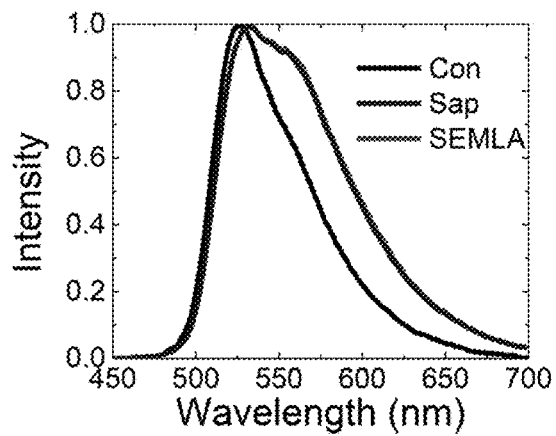

The performance characteristics of the green PHOLEDs with different substrates are shown in FIGS. 14A-14C. In FIG. 14A, the SEMLA and non-SEMLA devices essentially overlap other than at the low voltage, where the SEMLA device exhibited lower current density. FIG. 14B shows EQE as a function of brightness for the different substrates. FIG. 14C shows the spectra of the devices with no additional outcoupling at the substrate/air interface. The sapphire and SEMLA substrates effectively overlap, with the non-SEMLA device showing a lower intensity for wavelengths above approximately 525 nm. All devices have identical electrical characteristics since the SEMLA does not intrude into the device active region. The green-emitting device comparisons are obtained at a luminance of 100 cd/m². The SEMLA alone enhances $\eta_{EQE}$ from 25±3% for a PHOLED on a flat glass substrate to 30±3%, representing an improvement by an outcoupling enhancement factor (EF) of 1.2. The outcoupling is further enhanced by EF=1.9 to ηEQE=47±4% using an external MLA to improve substrate outcoupling. Using IMF at the glass-air interface in conjunction with the SEMLA extracts 65±5% (an EF=2.6) of the total generated photons, compared with 51±4% for conventional glass and 60±4% for sapphire substrates. The most efficient device using the SEMLA reaches ηEQE=70±4%. The spectra of PHOLEDs employing the SEMLA along with sapphire substrates are identical. It is slightly broader than that from conventional glass substrates due to weaker cavity effects in the SEMLA since $n_{SEMLA} \approx n_{sapphire} \approx n_{org}$.

Figure 15A:
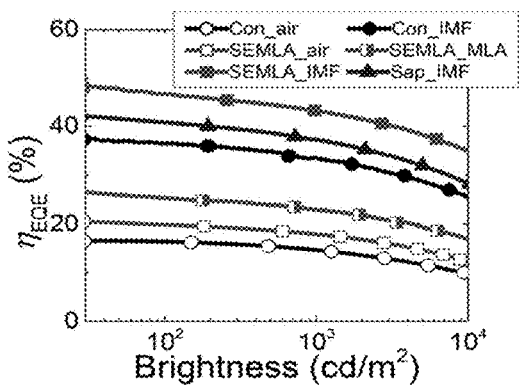
FIGS. 15A, 15B, 15C, and 15D show optical output characteristics of white phosphorescent OLEDs on various substrates according to embodiments disclosed herein.
Figure 15B:
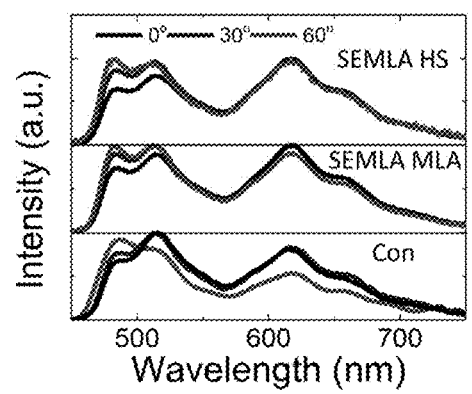
Figure 15C:
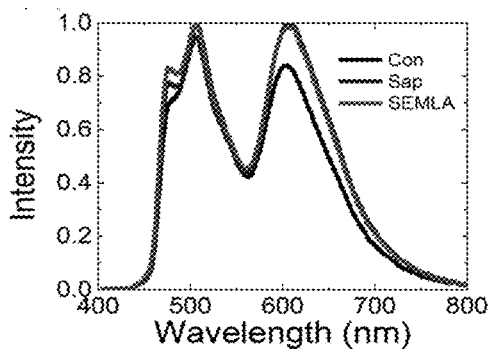
Figure 15D:
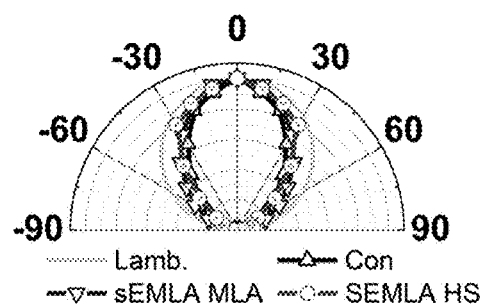

The optical output characteristics of white PHOLEDs (WOLEDs) on conventional glass (Con), SEMLA, and sapphire (Sap) substrates are shown in FIGS. 15A-15D. Measurements with no additional outcoupling at the substrate/air interface (air), with an external microlens array (MLA), and with index matching fluid (IMF) are indicated. FIG. 15A shows the external quantum efficiency ($\eta_{EQE}$) of WOLEDs on different substrates. FIG. 15B shows WOLED spectra on different substrates. The spectra are collected at the same current density (J), at which the luminance of the control (LCon) is 10,000 cd/m². FIG. 15C shows the spectra of devices on a conventional glass substrate (Con), a SEMLA substrate with an external MLA (SEMLA MLA), and a SEMLA substrate with a large hemispherical outcoupling lens with IMF (SEMLA HS) at 0°, 30°, and 60° to the substrate normal. The spectra were collected at the same J, at which LCon=5000 cd/m. FIG. 15D shows the angular luminosity distribution of WOLEDs on different substrates. Lamb. indicates an ideal Lambertian emission pattern.

As shown, it was found that the use of a SEMLA as disclosed herein achieved enhancement of $\eta_{EQE}$ from 16±2% for conventional glass substrates to 20±2% by EF=1.3. It can be further enhanced to 27±3% using an external MLA with EF=1.7. Using an IMF, the SEMLA extracts 45±4% (EF=2.8) of the total generated photons into the glass substrate, compared with 37±3% for conventional glass and 41±3% for sapphire substrates. The most efficient WOLED using the SEMLA reaches $\eta_{EQE}=50\pm3\%$ by EF=3.1. This efficiency is higher than known for conventional WOLEDs, limited primarily by the efficiency of the device rather than the outcoupling scheme. The spectra from the three different substrates without an external MLA are shown in FIG. 15B. Both sapphire and SEMLA substrates have high intensities in the red and blue spectral regimes compared with the conventional glass substrate, showing boarder spectra resulting from weaker cavity effects.

The WOLED spectra at different viewing angles on a glass, a SEMLA substrate with an external MLA (SEMLA MLA), and a SEMLA substrate with a large hemispherical outcoupling lens (SEMLA HS) are shown in FIG. 15C. The spectral blue shift at large angles is only observed for the control device. The SEMLA eliminates this common spectral shift at large angles, making it more suitable for display and white light illumination applications. The angular intensity profile of the conventional device is much narrower than a Lambertian source. In contrast, the SEMLA-modified substrates show higher intensities at large viewing angles, bringing them closer to a Lambertian source.

The simulated light extraction efficiency into the SEMLA (60% in FIG. 13B) is lower than measurements (65±5% in FIG. 14B), even when assuming 100% transmission (FIG. 13C) from the SEMLA into the glass substrate. The mismatch partially results from birefringence (with ordinary and extraordinary indicies of refraction of $n_o$=1.8 and $n_e$=1.6, respectively) of the electron transporting layer comprising 4,6-bis(3,5-di-3-pyridylphenyl)-2-methylpyrimidine; 4,6-bis(3,5-di-(pyridin-3-yl)phenyl)-2-methylpyrimidine (B3PYMPM), which is not considered in the simulation. The 10 to 30 µm thickness of the flat spacer layer is comparable with the coherence length of OLEDs, but it is nevertheless treated in the simulation as a semi-infinite plane, which may be another source of the differences with measurement.

The SEMLA extracts more light than the direct fabrication of the WOLEDs on high-index sapphire substrates (FIG. 14B and FIG. 15A), despite the fact that $n_{sapphire} \approx n_{SEMLA}$ and there is less than 100% transmission from the SEMLA into glass. The lower efficiency of the sapphire substrate results from two sources. First, there is a minor refractive index mismatch between sapphire and the IMF ($n_{sapphire}$=1.77, $n_{IMF,high}$=1.70) that reduces the outcoupling of light trapped in the substrate. Second, since the SEMLA thickness is comparable to the WOLED coherence length, the optical power distribution in the SEMLA may be subject to destructive interference. The mismatches between measurement and simulation and between the devices on sapphire and SEMLA substrates show that the SEMLA has reached the theoretical limit for light extraction. This indicates that the SEMLA extracts all emitted optical power with the exception of residual surface plasmon modes. The surface plasmon modes can be further enhanced using a thick ETL, as shown in FIG. 13B. Other SPP reduction strategies such as corrugated structures and optical gratings may also be integrated with the SEMLA, although they can potentially increase the fabrication complexity and costs.

Figure 16:
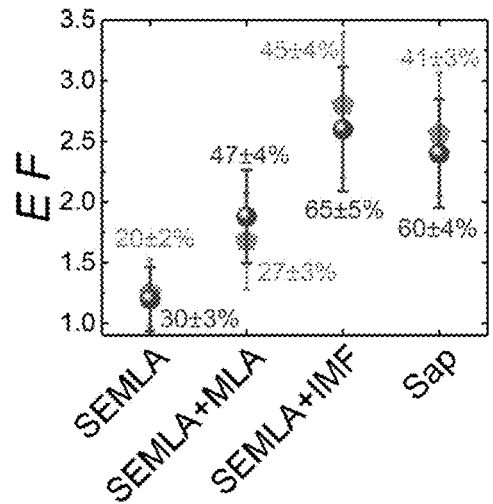
FIG. 16 shows the enhancement factor of green and white PHOLEDs on different substrates according to embodiments disclosed herein compared with conventional flat substrates.

FIG. 16 shows the enhancement factor (EF) of green and white PHOLEDs on different substrates as previously disclosed, compared with conventional flat substrates with identical OLED device structures. The $\eta_{EQE}$ of each configuration is indicated. The circles and pentagons denote the green and white PHOLEDS, respectively. The similar enhancement factors of light extraction from both the green and white PHOLEDs indicate that the SEMLA solution is independent of emission wavelength, as expected.

The spectra on the SEMLA and sapphire substrates are almost identical since the structure is nondiffractive. This also provides a guideline for cavity designs of OLEDs on SEMLA substrates. Compared with high refractive index substrates, the glass-air interface of the SEMLA substrate can more readily outcouple substrate modes. When employing external MLAs, the outcoupling into air for $n_{lens}/n_{out}$=1.5 is higher than for $n_{lens}/n_{out}$=1.8 in FIG. 13C. Thus, the SEMLA substrates replace sapphire substrates with higher efficiency and lower costs, at no expense to performance or freedom in device design.

An external MLA can enhance the $\eta_{EQE}$, but is not as efficient as the large hemispherical lens or the IMF, as shown in FIGS. 14B and 15A. The MLA only outcouples ~70% photons from the substrate and air modes combined. FIGS. 14b AND 16 show that ~20% of photons remain trapped in the substrate using the SEMLA in combination with the MLA. Other technologies for substrate mode extraction 8 appear to exhibit the same bottleneck. Solutions to improve extraction from substrate modes are, therefore, necessary to fully exploit the advantages of efficient waveguide and surface plasmon mode outcoupling structures such as the SEMLA.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively: then, the bipolar currents reach a steady state gradually. Typical CGL materials include n and p conductivity dopants used in the transport layers.

EXPERIMENTAL

The optical analysis disclosed herein assumes that an emitting dipole (wavelength of 540 nm) is located in the center of the emissive layer with a thickness of 20 nm and refractive index of 1.83. The emitting dipole has 77% horizontal and 23% vertical component emission due to dipole alignment of the green dopant material bis[2-(2-pyridinyl-N)phenyl-C](2,4-pentanedionato-O2,O4)iridium (III) (Ir(ppy)2acac). The thicknesses and refractive indices of each layer are 40 nm thick ITO with n=2.1, 40 nm thick hole transport layer with n=1.70, emissive and electron transport layers with n=1.78, and Al with a complex index of n=0.6+2.8i. The SEMLA and polymer planarization layers (both made of NOA 170, Norland Products Inc.) have n=1.8. All indices of refraction were measured with an ellipsometer. The glass refractive index is n=1.45.

For ray tracing simulations, the geometry in the simulation was a hexagonal array of close-packed hemispherical microlenses with an ITO, an organic layer, and a reflective metal on its planar surface. The refractive indices of the ITO and organic materials are identical to that of the microlenses, so no refraction was considered between the microlens-substrate interface and the metal surface. A 3% loss per pass through the ITO and 8% loss per reflection at the metal surface were assumed. The light was assumed to be unpolarized. At each incidence angle, the transmission was calculated for over 1000 rays evenly distributed over a unit cell and originating from within the organic layer. The azimuthal dependence was averaged to provide the transmission as a function of polar angle. To improve the computation speed, rays with a remaining relative intensity of less than 0.5% were eliminated.

To fabricate devices as disclosed herein, a photoresist (PR) layer spun onto a solvent-cleaned soda lime glass (UniversityWafer #3004169267) substrate was patterned with an I-line ×5 reduction AutoStep exposure system (GCA AS200) into a hexagonal array with 0.8 μm diameter circular openings with a 10 μm pitch. After a 10 min hard bake, the glass with patterned PR was immersed for 6.5 min in buffered HF Improved (Transene) diluted 6:1 with a surfactant. The PR was then removed by sonication in acetone and 2-proponal and a 20 min RCA cleaning step. The NOA-170 was spin-coated onto the etched glass substrate and cured under ultraviolet illumination. NOA-170 filled the etched microlens-shaped trenches and formed a ~20 μm thick flat layer above the microlens. After the subelectrode MLA preparation, a 40 nm thick ITO layer was deposited by radio frequency magnetron sputtering at 20 W in a chamber with an Ar pressure of 5 mTorr at a rate of 0.1 Å. The glass and sapphire substrates were cleaned by sonication in tergitol, deionized water, acetone, and 2-propanol and coated with ITO along with SEMLA substrates. Organic layers and top electrodes were deposited by vacuum thermal evaporation in a system with a base pressure of $10^{-7}$ Torr. The green PHOLED consists of a 2 nm thick MoO3, 40 nm thick 4,4'-cyclohexylidenebis[N,N-bis(4-methylphenyl)-benzenamine] (TAPC), 25 nm thick, 8 vol % Ir(ppy)2acac doped in 4,4'-bis(carbazol-9-yl)biphenyl (CBP), and 65 nm B3PYMPM. The white PHOLED structure consists of 2 nm thick MoO3, 50 nm thick TAPC, 15 nm thick 4 vol % Ir(ppy)2acac, 4 vol % bis(2-methyldibenzo[f,h]quinoxaline)-(acetylacetonate)iridium(III) (Ir(MDQ)2acac)

co-doped in CBP, 10 nm thick bis[2-(4,6-difluorophenyl) pyridinato-C2,N]-(picolinato)iridium(III) (FIrpic) 10 vol % doped with CBP, and 55 nm thick 3,3',5,5'-tetra[(M-pyridyl) phen-3-yl]biphenyl (BP4MPy). Finally, the cathode of 1.5 nm thick lithium quinolate and 100 nm thick Al was deposited through an array of 1 mm diameter openings in a shadow mask. The refractive indices and thicknesses of materials were measured using a variable-angle spectroscopic ellipsometer (J. A. Woollam, WVASE32). To measure the refractive index of NOA 170, it was mixed with propylene glycol methyl ether acetate, spin-coated on a silicon substrate, baked, and annealed under an ultraviolet lamp. Current-voltage-luminance characteristics were collected using a semiconductor parameter analyzer (HP-4156A) and a calibrated Si photodiode. The electroluminescence spectra were measured using an Ocean Optics miniature spectrometer. The $\eta_{EQE}$ was calculated using standard methods. The systematic error in the measurement setup is 6%. The external microlens array (Lumlight, MA1303001) was applied at the glass substrate before measurements. To measure the total light intensity in both the air and substrate modes, index-matching fluid was applied between the substrates and the photodiode.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   a glass substrate having a first surface and a second surface;
   an organic light emitting diode (OLED) disposed over the glass substrate and having an index of refraction of 1.7-2.0;
   a microlens array disposed at least partially within the glass substrate, the microlens array comprising a plurality of microlenses and having an index of refraction of 1.7-1.9, wherein at least a portion of each microlens of the plurality of microlenses is disposed between the first surface and the second surface of the glass substrate; and
   a reflective layer disposed below the substrate;
   wherein the device is a top-emitting device configured to emit light from a surface of the device closer to the OLED than the substrate.

2. The device of claim 1, wherein the microlens array has an index of refraction at least 1% greater than the index of refraction of the substrate.

3. The device of claim 1, wherein the spacer layer provides a planarizing layer disposed above the microlens array.

4. The device of claim 1, wherein the spacer layer has an index of refraction within 10% of the index of refraction of the microlens array.

5. The device of claim 4, wherein the index of refraction of the spacer layer is equal to the index of refraction of the microlens array.

6. The device of claim 1, wherein the microlens array has an index of refraction of not less than 1.7.

7. The device of claim 6, wherein the microlens array has an index of refraction of not less than 1.8.

8. The device of claim 6, wherein the glass substrate has an index of refraction of 1.4-1.5.

9. The device of claim 1, wherein at least one organic layer of the OLED has an index of refraction of not less than 1.7 and the microlens array has an index of refraction of not less than 1.7.

10. The device of claim 1, further comprising an exterior microlens array disposed outside the substrate.

11. The device of claim 10, wherein the substrate is disposed between the exterior microlens array and an OLED.

12. The device of claim 1, wherein each of the plurality of microlenses comprises a hemispherical microlens having a diameter of not more than 10 µm.

13. The device of claim 12, wherein the plurality of microlenses are arranged in a hexagonal array.

14. The device of claim 12, wherein the plurality of microlenses are closely-packed in the microlens array.

15. The device of claim 1, wherein the device is at least one type selected from the group consisting of: a flat panel display, a computer monitor, a medical monitor, a television, a billboard, a light for interior or exterior illumination and/or signaling, a heads-up display, a fully or partially transparent display, a flexible display, a laser printer, a telephone, a mobile phone, a tablet, a phablet, a personal digital assistant (PDA), a wearable device, a laptop computer, a digital camera, a camcorder, a viewfinder, a micro-display having an active area with a primary diagonal of 2 inches or less, a 3-D display, a virtual reality or augmented reality display, a vehicle, a video wall comprising multiple displays tiled together, a theater or stadium screen, and a sign.

16. The device of claim 1, further comprising:
   a spacer layer disposed between the OLED and the substrate and having a thickness of 10-30 µm;
   wherein the glass substrate has an index of refraction of 1.4-1.5;
   wherein the reflective layer is disposed between the microlens array and at least a portion of the substrate; and
   wherein the reflective layer is in direct physical contact with the microlens array.

* * * * *